(12) United States Patent
Lim et al.

(10) Patent No.: US 8,300,485 B2
(45) Date of Patent: Oct. 30, 2012

(54) SENSE AMPLIFIER AND SEMICONDUCTOR APPARATUS INCLUDING THE SAME

(75) Inventors: Kyu Nam Lim, Icheon-si (KR); Hong Sok Choi, Icheon-si (KR); Ki Myung Kyung, Icheon-si (KR); Mun Phil Park, Icheon-si (KR); Sun Hwa Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 12/962,254

(22) Filed: Dec. 7, 2010

(65) Prior Publication Data
US 2012/0005397 A1 Jan. 5, 2012

(30) Foreign Application Priority Data
Jul. 2, 2010 (KR) .................. 10-2010-0064005

(51) Int. Cl.
*G11C 7/02* (2006.01)
(52) U.S. Cl. .................. 365/207; 365/205; 365/230.06
(58) Field of Classification Search ........... 365/189.011, 365/203, 205, 208, 222, 230.06, 230.08
See application file for complete search history.

(56) References Cited

U.S. PATENT DOCUMENTS

| 6,717,879 | B2 * | 4/2004 | Tanaka ............... 365/189.18 |
| 7,154,797 | B1 * | 12/2006 | Saito et al. ............ 365/208 |
| 7,423,896 | B2 | 9/2008 | Lee |
| 7,460,388 | B2 | 12/2008 | Ilda |
| 7,477,558 | B2 | 1/2009 | Lee |
| 7,505,532 | B2 * | 3/2009 | Saito et al. ............ 375/318 |
| 2003/0156486 | A1 * | 8/2003 | Tanaka ............... 365/230.03 |
| 2005/0243621 | A1 | 11/2005 | Kuroda |
| 2007/0280020 | A1 | 12/2007 | Lee |
| 2008/0304340 | A1 | 12/2008 | Kyung |

FOREIGN PATENT DOCUMENTS

| KR | 1020040038449 A | 5/2004 |
| KR | 1020050120485 A | 12/2005 |

* cited by examiner

*Primary Examiner* — Gene Auduong
(74) *Attorney, Agent, or Firm* — William Park & Associates Ltd.

(57) ABSTRACT

A sense amplifier is configured to transfer data on a first data I/O line to a second data I/O line or to transfer data on the second data I/O line to the first data I/O line. The first data I/O line is substantially continuously coupled to the second data I/O line during an active operation.

35 Claims, 4 Drawing Sheets

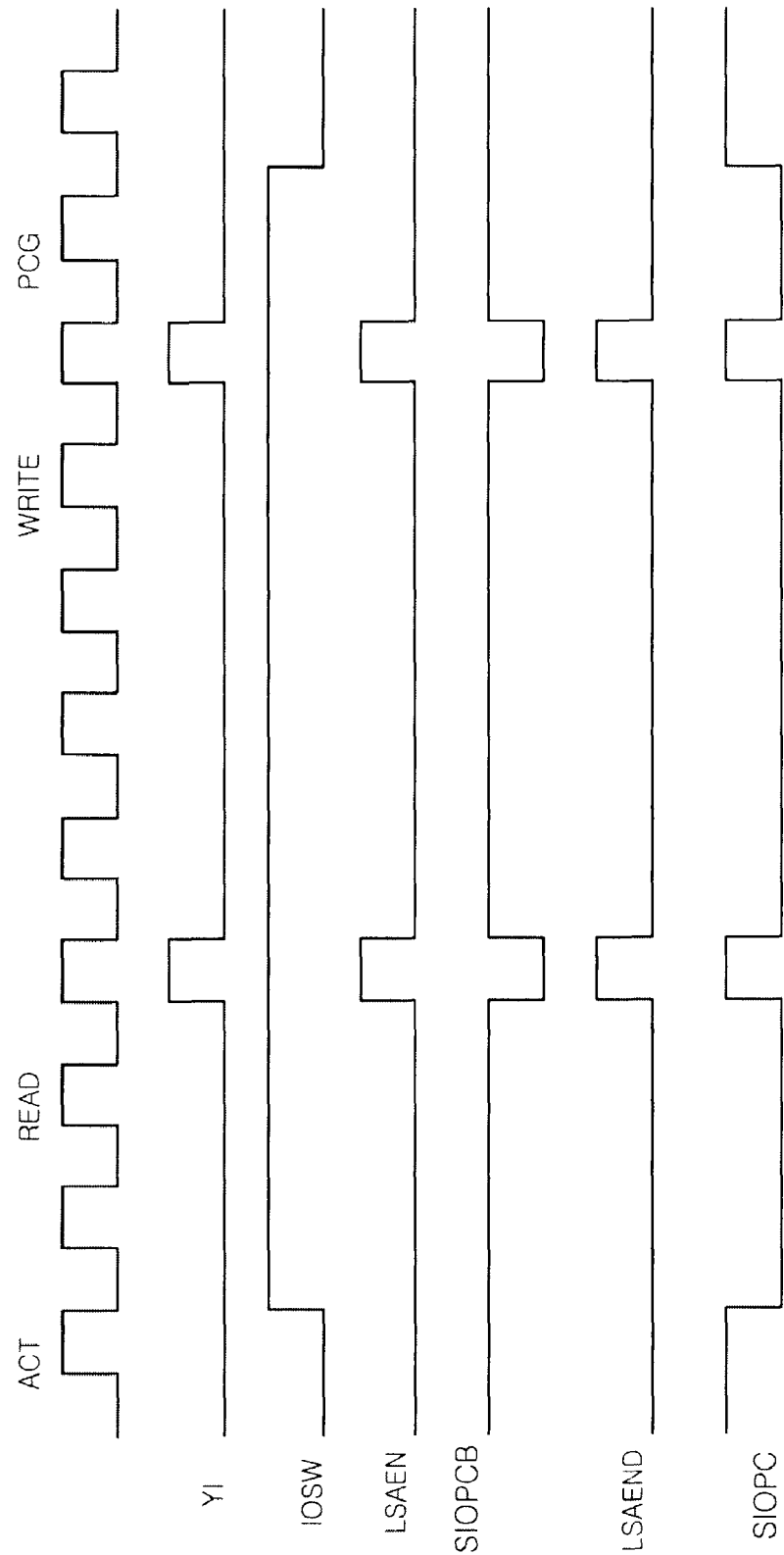

SENSE AMPLIFIER AND SEMICONDUCTOR APPARATUS INCLUDING THE SAME

CROSS-REFERENCES TO RELATED APPLICATION

The present application claims priority to Korean application number 10-2010-0064005, filed on Jul. 2, 2010, which is incorporated by reference in its entirety as set forth in full.

BACKGROUND OF THE INVENTION

1. Technical Field

Embodiments relate to a semiconductor apparatus, and more particularly to a sense amplifier of the semiconductor apparatus.

2. Related Art

Semiconductor apparatuses particularly memory devices include memory cells and data input/output (I/O) lines to perform the data I/O operations. The types of data I/O lines for data input/output include bit lines, local I/O lines, global I/O lines, etc. In a circuit layout, the data I/O line paths for data input/output tend to be very long, and the loads between the electrically connected data I/O lines are different from each other. To prevent the problems that may be caused by the above and in order to ensure reliable and consistent data transfer, the semiconductor memory apparatuses utilize sense amplifiers for amplifying the data signal strength.

FIG. 1 shows a conventional semiconductor memory apparatus. When data is to be outputted, the data stored in a memory cell (not shown) is loaded on the bit lines BL, BLB and amplified by the bit line sense amplifier BLSA. Then, the data on the bit lines BL, BLB is transferred to the segment I/O lines SIO, SIOB by a column selection signal CSL. The data transferred to the segment I/O lines SIO, SIOB is amplified by a local sense amplifier LSA 10 and transferred to local the I/O lines LIO, LIOB. The data transferred to the local I/O lines LIO, LIOB can then be transferred to a global I/O line (not shown), and the data on the global I/O line are transferable via a data pad (not shown) to an external device. When data is to be inputted, the data input path is in the reverse order of the data output path described above.

FIG. 2 shows the local sense amplifier LSA 10 of FIG. 1. The local sense amplifier 10 includes first to seventh transistors N1-N7. The first and second transistors N1, N2 couple the segment I/O lines SIO, SIOB and the local I/O lines LIO, LIOB to each other respectively in response to an internal write signal WE. The third and fourth transistors N3, N4 are coupled to the local I/O lines LIOB, LIO, respectively, in response to an internal read signal RD, and the fifth and sixth transistors N5, N6 are coupled to the segment I/O lines SIO and SIOB, respectively, and the seventh transistor N7 is turned on in response to the internal read signal RD and then enables a current to flow to a ground voltage terminal VSS. The internal read signal RD can be referred to as a sense amplifier enable signal LSAEN since the internal read signal RD enables the local sense amplifier 10 to differentially amplify the segment I/O lines SIO, SIOB. The conventional local sense amplifier 10 of FIG. 2 can discriminate read vs. write operations and perform the respective read/write operations. In particular, in a write operation, the local sense amplifier 10 allows the appropriate data transfer by coupling the local I/O lines LIO, LIOB to the respective segment I/O lines SIO, SIOB; and, in a read operation, the conventional local sense amplifier differentially amplifies data on the segment I/O lines SIO, SIOB to transfer the respective amplified data to the local I/O lines LIO, LIOB. That is, the conventional local sense amplifier 10 of FIGS. 1-2 can couple the segment I/O lines SIO, SIOB to the respective local I/O lines LIO, LIOB only when the internal write signal WE or the internal read signal RD is applied.

SUMMARY OF THE INVENTION

The embodiments of the present invention include a sense amplifier capable of operating accurately in high speed and a semiconductor memory apparatus including the same.

In an embodiment of the present invention, a sense amplifier is configured to transfer data on a first data I/O line to a second data I/O line or to transfer data on the second data I/O line to the first data I/O line, wherein the first data I/O line is substantially continuously coupled to the second data I/O line during an active operation.

A sense amplifier according to an embodiment of the present invention includes: a data line connecting unit configured to couple a first data I/O line to a second data I/O line in response to an I/O switch signal; and a hybrid data transfer unit configured to amplify the first data I/O line in response to a sense amplifier enable signal.

A semiconductor apparatus according to an embodiment of the present invention includes: a sense amplifier configured to transfer data between first and second data I/O lines in response to an I/O switch signal and a driving sense amplifier enable signal; and a precharge unit configured to precharge the first data I/O line in response to a driving precharge signal, wherein the driving sense amplifier enable signal and the driving precharge signal are generated in a cross area between a plurality of memory blocks.

A semiconductor apparatus according to an embodiment of the present invention may include: first and second memory blocks to which a plurality of bit lines are assigned; a first data I/O line configured to be coupled to the plurality of bit lines; a sense amplifier configured to transfer data between the first data I/O line and a second data I/O line and to substantially maintain an electrical connection of the first data I/O line and the second data I/O line during an active operation; and a precharge unit configured to precharge the first data I/O line, wherein a sense amplifier enable signal to control the sense amplifier and a precharge signal to control the precharge unit are generated in a column decoder block.

Further, a semiconductor apparatus according to an embodiment of the present invention may include: a sense amplifier configured to transfer data between a first data I/O line and a second data I/O line; and a precharge unit configured to precharge the first data I/O line and the second data I/O line, wherein an electrical connection between the first data I/O line and the second data I/O line is substantially maintained during an active operation.

A sense amplifier according to an embodiment of the present invention is configured to include a hybrid data transfer unit which differentially amplifies a first data I/O line in a read operation and a write operation, wherein the first data I/O line is substantially continuously coupled to the second data I/O line during an active operation.

BRIEF DESCRIPTION OF THE DRAWINGS

Features, aspects, and embodiments are described in conjunction with the attached drawings, in which;

FIG. 5 is a timing diagram showing an operation of the semiconductor apparatus according to an embodiment of the present invention.

DETAILED DESCRIPTION OF THE PREFERRED EMBODIMENTS

Hereinafter, a sense amplifier and a semiconductor apparatus including the same will be described below with reference to the accompanying drawings through preferred embodiments of the present invention.

Figure 1:
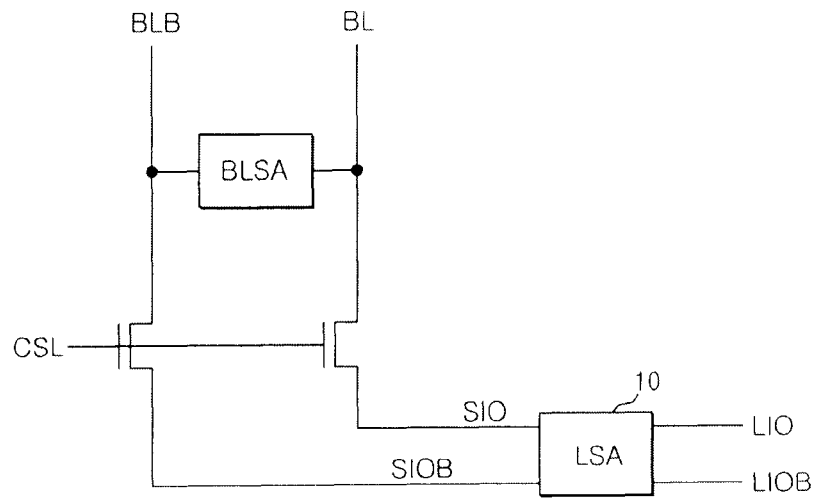
FIG. 1 shows a conventional semiconductor apparatus according to the prior art.
Figure 2:
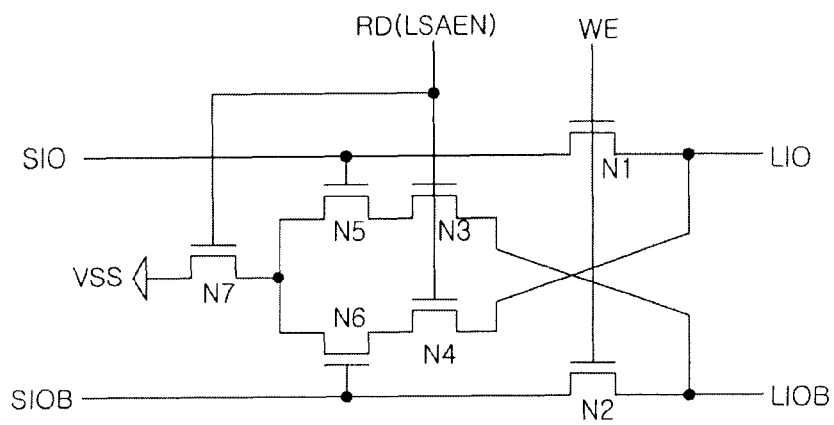
FIG. 2 shows a local sense amplifier of FIG. 1.
Figure 3:
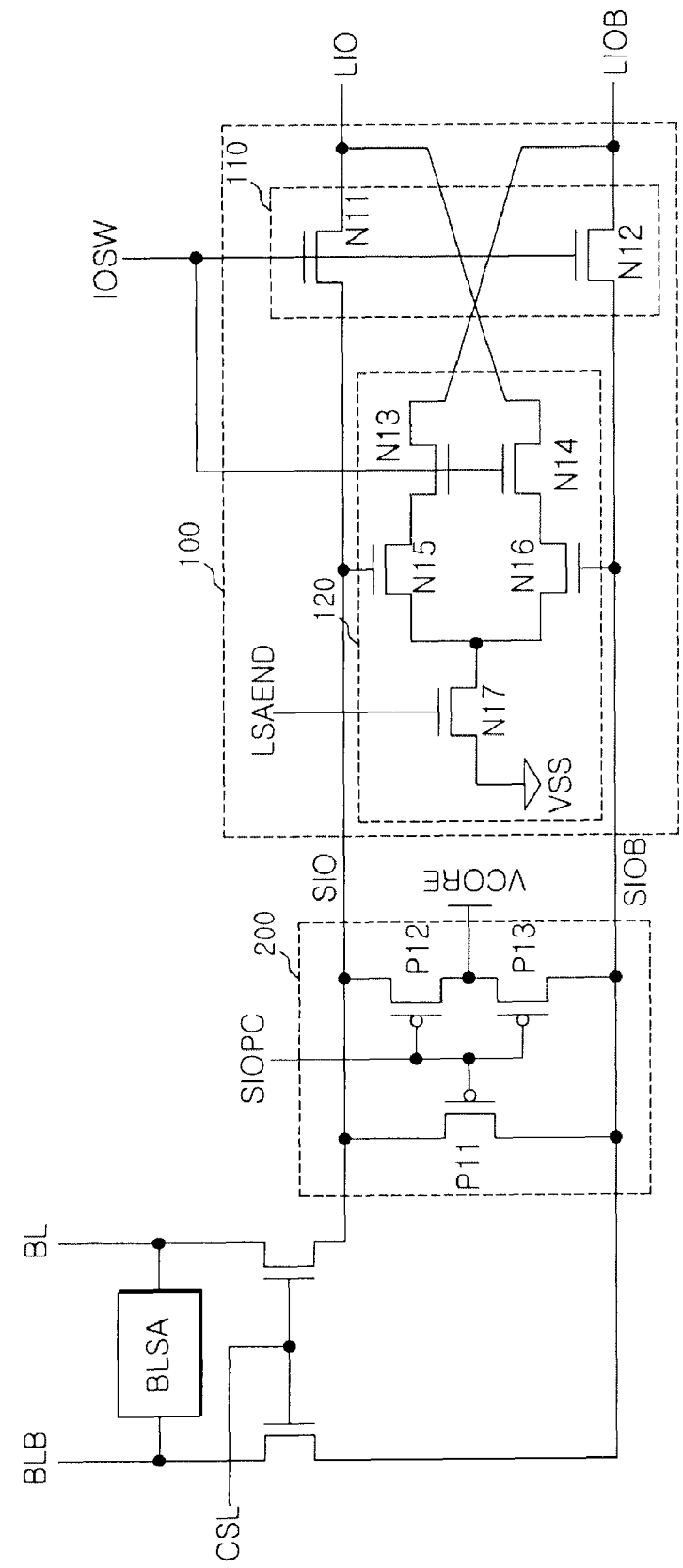
FIG. 3 is a diagram schematically showing a configuration of a sense amplifier and a semiconductor apparatus including the same according to an embodiment of the present invention.

FIG. 3 shows a sense amplifier 100 and a semiconductor apparatus 1 having the sense amplifier 100 according to an embodiment of the present invention. The sense amplifier 100 transfers data on first data I/O lines SIO, SIOB to second data I/O lines LIO, LIOB (i.e., a read operation) or transfers data on the second data I/O lines LIO, LIOB to the first data I/O lines SIO, SIOB (i.e., a write operation). The sense amplifier 100 can maintain electrical connection between the first data I/O lines SIO, SIOB and the respective second data I/O lines LIO, LIOB during an active operation of the semiconductor apparatus 1.

The sense amplifier 100 includes a data line connecting unit 110 and a hybrid data transfer unit 120. In FIG. 3, the data line connecting unit 110 couples the first data I/O lines SIO, SIOB to the respective second data I/O lines LIO, LIOB in response to an I/O switch signal IOSW. Therefore, when the I/O switch signal IOSW is enabled, the data (that is, a signal embodying the data) on the second data I/O lines LIO, LIOB can be transferred to the first data I/O lines SIO, SIOB, and, likewise, the data (that is, a signal embodying the data) on the first data I/O lines SIO, SIOB can be transferred to the second data I/O lines LIO, LIOB.

The hybrid data transfer unit 120 is coupled to the first data I/O lines SIO, SIOB and the second data I/O lines LIO, LIOB in response to the I/O switch signal IOSW and differentially amplifies the data signal on the first data I/O lines SIO, SIOB in response to a sense amplifier enable signal LSAEN or a driving sense amplifier enable signal LSAEND derived from LASEN. In other words, when the sense amplifier enable signal LSAEN or the driving sense amplifier enable signal LSAEND is enabled, the hybrid data transfer unit 120 differentially amplifies the data on the first data I/O lines SID, SIOB and transfers the amplified data to the second data I/O lines LIO, LIOB or amplifies data transferred from the second data I/O lines LIO, LIOB.

In an embodiment of the present invention, the I/O switch signal IOSW is a signal generated from an active signal and a row selection signal and used to select the second data I/O lines LIO, LIOB for coupling with the first data I/O lines SIO, SIOB. The active signal is a signal which can be generated in response to an externally applied active command (such as a signal from a controller) so that the semiconductor apparatus 1 can be enabled to perform a read or write operation at a precharge state. The row selection signal is a signal to select a row of memory block of the semiconductor apparatus 1, and it can, for example, be a signal to select a word line.

Since the sense amplifier 100 couples the first data I/O lines SIO, SIOB to the second data I/O lines LIO, LIOB in response to the I/O switch signal IOSW, the sense amplifier 100 continuously couples the first data I/O lines SIO, SIOB to the second data I/O lines LIO, LIOB when the semiconductor apparatus 1 is in an active state.

The sense amplifier enable signal LSAEN is a signal generated from an internal read signal or an internal write signal which is generated inside the semiconductor apparatus 1 when a read or write command is applied from an external source such as a controller, so that the semiconductor apparatus 1 can perform the read or write operation. The driving sense amplifier enable signal LSAEND is generated from the sense amplifier enable signal LSAEN and will be described in detail later.

Although the data line connecting unit 110 substantially maintains the electrical connection of the first data I/O lines SIO, SIOB and the second data I/O lines LIO, LIOB during the active operation, the sense amplifier 100 according to an embodiment of the present invention can perform the read or write operation with accuracy, because the hybrid data transfer unit 120 differentially amplifies the first data I/O lines SIO, SIOB in a write operation as well as in a read operation. In detail, although the first data I/O lines SIO, SIOB are continuously coupled to the second data I/O lines LIO, LIOB during the active operation, the hybrid data transfer unit 120 enables the data on the first data I/O lines SIO, SIOB to be accurately transferred to the second data I/O lines LIO, LIOB in a read operation, and similarly the hybrid data transfer unit 120 enables the data on the second data I/O lines LIO, LIOB to be accurately transferred to the first data I/O lines SIO, SIOB in a write operation.

As shown in FIG. 3, the semiconductor apparatus 1 further includes a precharge unit 200. The precharge unit 200 precharges the first data I/O lines SIO, SIOB in response to a driving precharge signal SIOPC. In detail, the precharge unit 200 provides a core voltage VCORE to the first data I/O lines SIO, SIOB in response to the driving precharge signal SIOPC so as to enable the first data I/O lines SIO, SIOB to be precharged to the core voltage VCORE level. The core voltage VCORE is a voltage used in a memory bank of the semiconductor apparatus 1. The driving precharge signal SIOPC is a signal which can be generated from a precharge signal SIOPCB and generated when the semiconductor apparatus 1 receives the active command from an external source such as a controller like the I/O switch signal IOSW. The driving precharge signal SIOPC is a signal which can be disabled when the semiconductor apparatus 1 receives the read or write command from an external source such as a controller, and thus the internal read signal or the internal write signal is generated.

Although not shown in FIG. 3, the I/O switch signal IOSW is generated from a row decoder block of the semiconductor apparatus 1, because the I/O switch signal IOSW is generated from the active signal or the row selection signal, and the driving sense amplifier enable signal LSAEND and the driving precharge signal SIOPC are generated from a column decoder block of the semiconductor apparatus 1. Details will be described later.

In FIG. 3, the data line connecting unit 110 includes first and second NMOS transistors N11, N12. The first NMOS transistor N11 receives the I/O switch signal IOSW through its gate terminal and couples the first data I/O line SIO to the second data I/O line LIO when the I/O switch signal IOSW is enabled. The second NMOS transistor N12 receives the I/O switch signal IOSW through its gate terminal and couples the first data I/O line SIOB to the second data I/O line LIOB when the I/O switch signal IOSW is enabled.

In FIG. 3, the hybrid data transfer unit 120 includes third to seventh NMOS transistors N13-N17. The third NMOS transistor N13 receives the I/O switch signal IOSW through its gate terminal and couples the second data I/O line LIOB to a first terminal of the fifth NMOS transistor N15 when the I/O switch signal IOSW is enabled. The fourth NMOS transistor N14 receives the I/O switch signal IOSW through its gate terminal and couples the second data I/O line LIO to a first terminal of the sixth NMOS transistor N16 when the I/O switch signal IOSW is enabled. The fifth NMOS transistor N15 is coupled to the first data I/O line SIO through its gate terminal and is coupled to a first terminal of the seventh NMOS transistor N17 through its second terminal. The sixth NMOS transistor N16 is coupled to the first data I/O line SIOB through its gate terminal and is coupled to the first terminal of the seventh NMOS transistor N17 through its second terminal. The seventh NMOS transistor N17 receives the driving sense amplifier enable signal LSAEND through its gate terminal and couples its second terminal to the ground voltage terminal VSS when the driving sense amplifier enable signal LSAEND is enabled. Therefore, the hybrid data transfer unit 120 has a configuration of a differential amplifier circuit and can be enabled to perform the differential amplification operation when the driving sense amplifier enable signal LSAEND is enabled. In other words, when the hybrid data transfer unit 120 is enabled, the hybrid data transfer unit 120 turns on the fifth and sixth NMOS transistors N15, N16 complementarily based on levels of the first data I/O lines SIO, SIOB, and thereby can amplify the data on the first data I/O lines SIO, SIOB.

The precharge unit 200 includes first to third PMOS transistors P11-P13. The respective first to third PMOS transistors P11-P13 receives the driving precharge signal SIOPC through their gate terminals. Therefore, when the driving precharge signal SIOPC is enabled, the first to third PMOS transistors P11-P13 provide the core voltage VCORE to the first data I/O lines SIO, SIOB and thus precharge the first data I/O lines SIO, SIOB.

In such a configuration, when the semiconductor apparatus 1 is in the active state, the sense amplifier 100 couples the first data I/O lines SIO, SIOB to the second data I/O lines LIO, LIOB continuously substantially through out the active state in response to the I/O switch signal IOSW. Therefore, when the precharge unit 200 precharges the first data I/O lines SIO, SIOB, an effect of precharging the first data I/O lines SIO, SIOB can have an influence on the second data I/O lines LIO, LIOB. Therefore, the semiconductor apparatus 1 according to an embodiment of the present invention makes it easier to precharge the second data I/O lines LIO, LIOB.

Figure 4:
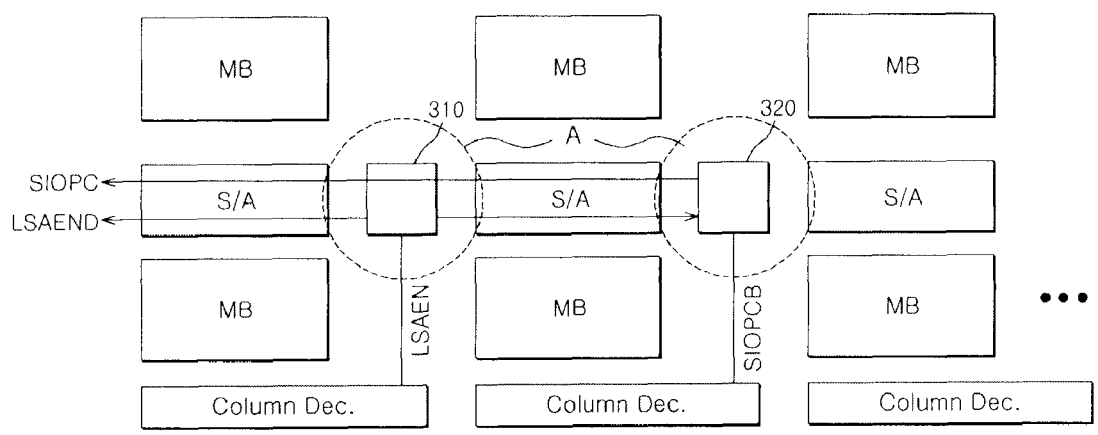
FIG. 4 is a diagram showing a configuration of the semiconductor apparatus according to an embodiment of the present invention.
Figure 4:
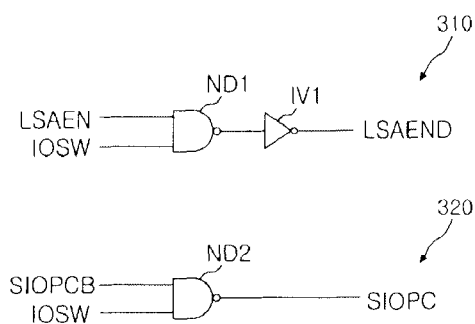

FIG. 4 shows an overview configuration of the semiconductor apparatus 1 according to an embodiment of the present invention. As shown in FIG. 4, the semiconductor apparatus 1 includes, inter alia, a plurality of memory blocks MB, a plurality of local sense amplifier blocks S/A, a plurality of column decoder blocks Column Dec. and a plurality of driver blocks A. Referring to FIGS. 3-4, each of the plurality of memory blocks MB includes a plurality of bit lines BL, BLB communicating with memory cells inside the memory block MB. Although not shown in FIG. 4, the memory cells in each memory block MB can communicate with the bit lines BL, BLB by the bit line sense amplifier BLSA, and the first data I/O lines SIO, SIOB can be coupled to the bit lines BL, BLB by a column selection switch CSL.

The first data I/O lines SIO, SIOB are coupled to the second data I/O lines LIO, LIOB through the sense amplifier block S/A. The sense amplifier block S/A denotes all of the sense amplifier 100 and the precharge unit 200 which are included in the semiconductor apparatus 1 based on the number of the first data I/O lines SIO, SIOB and the second data I/O lines LIO, LIOB of FIG. 3.

The column decoder block Column Dec. generates a column address signal for a column selection of the semiconductor apparatus 1. In addition, the Column Dec. generates the sense amplifier enable signal LSAEN and the precharge signal SIOPCB. As stated above, the sense amplifier enable signal LSAEN and the precharge signal SIOPCB can be generated inside the semiconductor apparatus 1 in response to the active command and the read or write command. The semiconductor apparatus 1 according to an embodiment of the present invention is implemented such that the Column Dec. generates the sense amplifier enable signal LSAEN and the precharge signal SIOPCB. Therefore, since the sense amplifier enable signal LSAEN and the precharge signal SIOPCB are generated in the Column Dec., they have substantially the same transmission direction as the column selection signal (refer to CSL in FIG. 3) for the column selection of the semiconductor apparatus 1. Accordingly, in a read or write operation, the read or write operation can be performed more accurately, and an accurate operation timing point can be secured because all of the plurality of signals relating to the read or write operation can be transferred to substantially the same direction.

As shown by an area A in FIG. 4, the driver blocks 310, 320 are located between a number of memory blocks MB. An area A is located where X direction and Y direction can intersect between the memory blocks MB. The driver blocks 310, 320 receive the sense amplifier enable signal LSAEN, the precharge signal SIOPCB, and the I/O switch signal IOSW to generate the driving sense amplifier enable signal LSAEND and the driving precharge signal SIOPC. The driver blocks 310, 320 located in the area A of the semiconductor apparatus 1 can amplify and drive the I/O switch signal IOSW transferred from a row decoder block, i.e., in the X direction, and the sense amplifier enable signal LSAEN and the precharge signal SIOPCB transferred from the Column Dec., i.e., in the Y direction, and the driver blocks 310, 320 can transfer the driven signals to the sense amplifier block S/A. As shown in FIG. 4, the driver block 310 drives the sense amplifier enable signal LSAEN to generate the driving sense amplifier enable signal LSAEND, and the driver block 320 drives the precharge signal SIOPCB to generate the driving precharge signal SIOPC. Therefore, the driver block 310 provides the driving sense amplifier enable signal LSAEND to the sense amplifier blocks S/A, which are located on both side of the driver block 310, and the driver block 320 provides the driving precharge signal SIOPC to the sense amplifier blocks S/A, which are located in line on one side of the driver block 320. However, it should be noted that the location of the driver blocks 310, 320 are not restricted only to the area A as shown in FIG. 4. That is, in some alternative implementations, the driver block 320 which drives the precharge signal SIOPCB to generate the driving precharge signal SIOPC can be located in substantially the same location as the driver block 310 generating the driving sense amplifier enable signal LSAEND and thus can provide the driving precharge signal SIOPC to the sense amplifier blocks S/A which are located in both side of the driver block 320.

In the area A of FIG. 4, the driver block 310 includes a first NAND gate ND1 and a first inverter IV1. The first NAND gate ND1 receives the sense amplifier enable signal LSAEN and the I/O switch signal IOSW. The first inverter IV1 inverts an output of the first NAND gate ND1 to generate the driving sense amplifier enable signal LSAEND. The driver block 320 includes a second NAND gate ND2. The second NAND gate ND2 receives the precharge signal SIOPCB and the I/O switch signal IOSW to generate the driving precharge signal SIOPC. The driver blocks 310, 320 located in the area A drive the sense amplifier enable signal LSAEN and the precharge signal SIOPCB together with the I/O switch signal IOSW to generate the driving sense amplifier enable signal LSAEND and the driving precharge signal SIOPC. Therefore, the driver blocks 310, 320 can generate the driving sense amplifier enable signal LSAEND and the driving precharge signal SIOPC at an accurate timing point so as to prevent skew occurring with respect to each other. Therefore, the sense amplifier 100 and the precharge unit 200 which operate in response to the driving sense amplifier enable signal LSAEND and the driving precharge signal SIOPC, respectively, can operate with more accuracy. Therefore, the semiconductor apparatus 1 can perform a read or write operation in a higher speed with more accuracy.

FIG. 5 is a timing diagram showing an operation of the semiconductor apparatus 1 according to an embodiment of the present invention. Hereinafter, an operation of the semiconductor apparatus 1 will be described with reference to FIGS. 3-5.

When an active command ACT is applied from an external source such as a controller, the I/O switch signal IOSW is enabled. Then, referring to FIG. 3, the first and second NMOS transistors N11, N12 in the data line connecting unit 110 and the third and fourth NMOS transistors N13, N14 in the hybrid data transfer unit 120 receive the I/O switch signal IOSW to be turned on. Therefore, the first data I/O lines SIO, SIOB are coupled respectively to the second data I/O lines LIO, LIOB. The driver block 320 shown in FIG. 4 drives the precharge signal SIOPCB and the I/O switch signal IOSW to generate the driving precharge signal SIOPC, and the precharge unit 200 precharges the first data I/O lines SIO, SIOB to the core voltage VCORE level. At this time, since the first data I/O lines SIO, SIOB are coupled to the second data I/O lines LIO, LIOB, the effect that the precharge unit 200 precharges the first data I/O lines SIO, SIOB can have an influence on the second data I/O lines LIO, LIOB as well, and this make it easier to precharge the second data I/O lines LIO, LIOB.

When a read command READ is applied after the active command ACT, the sense amplifier enable signal LSAEN is enabled, and the precharge signal SIOPCB is disabled. The driver block 310 as shown in FIG. 4 drives the sense amplifier enable signal LSAEN to enable the driving sense amplifier enable signal LSAEND, and the driver block 320 drives the precharge signal SIOPCB to disable the driving precharge signal SIOPC. Therefore, the first to third PMOS transistors P11-P13 in the precharge unit 200 are all turned off, and the precharge state of the first data I/O lines SIO, SIOB is removed. Moreover, since the seventh NMOS transistor N17 is turned on, the hybrid data transfer unit 120 is enabled and differentially amplifies data on the first data I/O lines SIO, SIOB to transfer the amplified data to the second data I/O lines LIO, LIOB. When the read operation is completed, the precharge signal SIOPCB is enabled again. Since the first and second NMOS transistors N11, N12 maintain the electrical connection of the first data I/O lines SIO, SIOB and the second data I/O lines LIO, LIOB in response to the I/O switch signal IOSW, the precharge effect of the precharge unit 200 can have an influence on the second data I/O lines LIO, LIOB as well as the first data I/O lines SIO, SIOB.

When a write command WRITE is applied thereafter, the sense amplifier enable signal LSAEN is enabled, and the precharge signal SIOPCB is disabled. Therefore, data on the second data I/O lines LIO, LIOB can be transferred to the first data I/O lines SIO, SIOB, and then the hybrid data transfer unit 120 amplifies the data transferred to the first data I/O lines SIO, SIOB. Finally, when a precharge command PCG is applied, the I/O switch signal IOSW is disabled, and the first to fourth NMOS transistors N11-N14 are all turned off, thereby the electrical connection of the first data I/O lines SIO, SIOB and the second data I/O lines LIO, LIOB is removed.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A sense amplifier configured to transfer data on first data I/O lines to second data I/O lines or to transfer data on the second data I/O lines to the first data I/O lines, wherein the first data I/O line is coupled to the second data I/O line continuously during an active operation.

2. The sense amplifier of claim 1, wherein the sense amplifier is configured to couple the first and second data I/O lines in response to an I/O switch signal enabled to select the second data I/O line.

3. The sense amplifier of claim 2, wherein the I/O switch signal is generated from an active signal or a row selection signal.

4. A sense amplifier comprising:
a data line connecting unit configured to couple first data I/O lines to second data I/O lines in response to an I/O switch signal; and
a hybrid data transfer unit configured to amplify the first data I/O line in response to a sense amplifier enable signal.

5. The sense amplifier of claim 4, wherein the I/O switch signal is generated from an active signal or a row selection signal.

6. The sense amplifier of claim 4, wherein the sense amplifier enable signal is generated from a read or write command.

7. The sense amplifier of claim 6, wherein the sense amplifier enable signal is generated from a column decoder block.

8. The sense amplifier of claim 4, wherein the hybrid data transfer unit is configured to differentially amplify data on the first data I/O lines to transfer the data to the second data I/O lines or differentially amplify the first data I/O lines based on data transferred from the second data I/O lines, when the sense amplifier enable signal is enabled.

9. A semiconductor apparatus comprising:
a sense amplifier configured to transfer data between first and second data I/O lines in response to an I/O switch signal and a driving sense amplifier enable signal; and
a precharge unit configured to precharge the first data I/O lines in response to a driving precharge signal,
wherein the driving sense amplifier enable signal and the driving precharge signal are generated by one or more elements in a circuit area between a plurality of memory blocks.

10. The semiconductor apparatus of claim 9, wherein the sense amplifier is configured to couple first and second data I/O lines to each other in response to the I/O switch signal and to differentially amplify the first data I/O lines in response to the driving sense amplifier enable signal.

11. The semiconductor apparatus of claim 9, wherein the I/O switch signal is generated from an active signal or a row selection signal.

12. The semiconductor apparatus of claim 9, wherein the semiconductor apparatus further includes a driver block located in the circuit area between the memory blocks to receive a sense amplifier enable signal, a precharge signal, and the I/O switch signal to generate the driving sense amplifier enable signal and the driving precharge signal.

13. The semiconductor apparatus of claim 12, wherein the sense amplifier enable signal is generated from a read or write command.

14. The semiconductor apparatus of claim 12, wherein the sense amplifier enable signal and the precharge signal are generated from a column decoder block.

15. The semiconductor apparatus of claim 9, wherein the precharge unit is configured to precharge the first data I/O lines with a core voltage in response to the driving precharge signal.

16. A semiconductor apparatus comprising:
   first and second memory blocks to which a plurality of bit lines are assigned;
   a bit line sense amplifier configured to amplify the plurality of bit lines;
   first data I/O lines configured to be coupled to the plurality of bit lines;
   a sense amplifier configured to transfer data between the first data I/O lines and a second data I/O lines and to maintain an electrical connection of the first data I/O lines and the second data I/O lines substantially during an active operation; and
   a precharge unit configured to precharge the first data I/O line,
   wherein a sense amplifier enable signal to control the sense amplifier and a precharge signal to control the precharge unit are generated in a column decoder block.

17. The semiconductor apparatus of claim 16, wherein the semiconductor apparatus further includes a driver block configured to receive the sense amplifier enable signal, the precharge signal, and an I/O switch signal to generate a driving sense amplifier enable signal and a driving precharge signal.

18. The semiconductor apparatus of claim 17, wherein the driver block is located in a circuit area between the first and second memory blocks.

19. The semiconductor apparatus of claim 17, wherein the sense amplifier is configured to couple the first and second data I/O lines to each other in response to the I/O switch signal and to differentially amplify the first data I/O line in response to the driving sense amplifier enable signal.

20. The semiconductor apparatus of claim 17, wherein the I/O switch signal is generated from an active signal or a row selection signal.

21. The semiconductor apparatus of claim 16, wherein the precharge unit is configured to precharge the first data I/O lines with a core voltage.

22. A semiconductor apparatus comprising:
   a sense amplifier configured to transfer data between first data I/O lines and second data I/O lines; and
   a precharge unit configured to precharge the first data I/O lines and the second data I/O lines,
   wherein an electrical connection between the first data I/O lines and the second data I/O lines is maintained during an active operation.

23. The semiconductor apparatus of claim 22, wherein a signal to control the sense amplifier and a signal to control the precharge unit are generated from a column decoder block.

24. The semiconductor apparatus of claim 23, wherein the signal to control the sense amplifier and the signal to control the precharge unit are driven in a circuit area between a plurality of memory blocks.

25. The semiconductor apparatus of claim 22, wherein the precharge unit is configured to precharge the first and second data I/O lines to a core voltage level.

26. A sense amplifier comprising a hybrid data transfer unit which differentially amplifies first data I/O lines in a read operation and a write operation,
   wherein the first data I/O lines are coupled to the second data I/O line continuously during an active operation.

27. The sense amplifier of claim 26, wherein the hybrid data transfer unit is configured to differentially amplify the first data I/O lines in response to a sense amplifier enable signal generated from a read command or a write command.

28. The sense amplifier of claim 26, wherein the sense amplifier enable signal is generated from a column decoder block.

29. The sense amplifier of claim 26, wherein the sense amplifier enable signal is driven in a circuit area between a plurality of memory blocks.

30. A semiconductor apparatus having memory blocks having memory cells capable of storing data therein, wherein the stored data are accessible via bit lines, the semiconductor apparatus comprising:
   first data I/O lines connected to the bit lines;
   second data I/O lines;
   a sense amplifier capable of connecting the first data lines to the second data lines continuously during an active operation period.

31. The semiconductor apparatus of claim 30, wherein the data from the memory cells are transferable to the second data I/O lines, and wherein the data on the second data I/O lines are transferable to the memory cells.

32. The semiconductor apparatus of claim 31, wherein the sense amplifier comprises:
   a hybrid data transfer unit configured to differentially amplify a data signal on the first data I/O lines; and
   a data line connecting unit configured to connect the first data I/O lines and the second data I/O lines.

33. The semiconductor apparatus of claim 32, wherein an I/O switch signal is provided to the hybrid data transfer unit and the data line connecting unit during the active operation period so as to couple the first data I/O lines and the second data I/O lines continuously during the active operation period.

34. The semiconductor apparatus of claim 33, wherein an sense amplifier driving signal is provided to the hybrid data transfer unit to differentially amplify the first data I/O lines during the active operation period.

35. The semiconductor apparatus of claim 33, wherein the I/O switch signal is generated from an active signal provided from an external source including a controller or a row selection signal.

* * * * *